United States Patent
Ishihara

(10) Patent No.: US 11,742,306 B2
(45) Date of Patent: Aug. 29, 2023

(54) LAYOUTS FOR PADS AND CONDUCTIVE LINES OF MEMORY DEVICES, AND RELATED DEVICES, SYSTEMS, AND METHODS

(71) Applicant: Micron Technology, Inc., Boise, ID (US)

(72) Inventor: Takashi Ishihara, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/180,552

(22) Filed: Feb. 19, 2021

(65) Prior Publication Data
US 2022/0216168 A1 Jul. 7, 2022

Related U.S. Application Data

(60) Provisional application No. 63/134,906, filed on Jan. 7, 2021.

(51) Int. Cl.
*H01L 23/00* (2006.01)
*G11C 5/14* (2006.01)

(52) U.S. Cl.
CPC .............. *H01L 24/06* (2013.01); *G11C 5/14* (2013.01); *H01L 24/05* (2013.01); *H01L 2224/04042* (2013.01); *H01L 2224/05548* (2013.01); *H01L 2224/05554* (2013.01)

(58) Field of Classification Search
CPC ............. H01L 24/06; H01L 24/05; H01L 2224/04042; H01L 2224/05548; H01L 2224/05554; G11C 5/14
See application file for complete search history.

(56) References Cited

U.S. PATENT DOCUMENTS

| | | | | |
|---|---|---|---|---|
| 4,630,355 | A * | 12/1986 | Johnson | H05K 1/0293 29/829 |
| 6,437,364 | B1 * | 8/2002 | Wu | H01L 22/34 438/18 |
| 10,115,709 | B1 * | 10/2018 | Sasaki | H01L 22/32 |
| 2004/0100293 | A1 * | 5/2004 | Bottcher | G01R 31/2884 324/754.03 |
| 2008/0031067 | A1 * | 2/2008 | Lovett | G11C 7/1048 365/208 |
| 2008/0205133 | A1 * | 8/2008 | Gonzalez | H01L 27/108 257/E27.084 |

(Continued)

FOREIGN PATENT DOCUMENTS

CN 113711344 A * 11/2021 ......... H01L 21/7685

*Primary Examiner* — Mamadou L Diallo
(74) *Attorney, Agent, or Firm* — TraskBritt

(57) ABSTRACT

Layouts for pads and conductive lines of memory devices are disclosed. A memory device may include memory cells and conductive lines arranged above memory cells. The conductive lines may extend from substantially a first side of the memory device to substantially a second side of the memory device. Each of the conductive lines may be electrically coupled to a bond pad, a first probe pad and a second probe pad. The bond pad may be positioned at or near the first side and be configured to receive power. The first probe pad may be positioned at or near the first side and be configured to be electrically coupled to a probe. The second probe pad may be positioned at or near the second side. Associated systems and methods are also disclosed.

33 Claims, 10 Drawing Sheets

(56) References Cited

U.S. PATENT DOCUMENTS

| | | | |
|---|---|---|---|
| 2010/0226166 A1* | 9/2010 | Jung | H01L 29/66181 |
| | | | 257/E29.345 |
| 2010/0276816 A1* | 11/2010 | Ali | H01L 24/06 |
| | | | 257/E21.59 |
| 2012/0161129 A1* | 6/2012 | Chen | H01L 22/32 |
| | | | 257/E21.59 |
| 2015/0035162 A1* | 2/2015 | Lan | H01L 28/10 |
| | | | 716/110 |
| 2017/0373040 A1* | 12/2017 | Pagani | H01L 23/481 |
| 2019/0043769 A1* | 2/2019 | Melville | G01R 31/2884 |
| 2019/0287879 A1* | 9/2019 | Sauter | H01L 23/488 |
| 2020/0381379 A1* | 12/2020 | Chen | H01L 23/544 |
| 2020/0395254 A1* | 12/2020 | Chen | H01L 22/32 |
| 2021/0082896 A1* | 3/2021 | Harashima | H01L 25/18 |
| 2021/0327888 A1* | 10/2021 | Wang | H01L 27/0733 |
| 2022/0102333 A1* | 3/2022 | Li | H01L 25/50 |

* cited by examiner

LAYOUTS FOR PADS AND CONDUCTIVE LINES OF MEMORY DEVICES, AND RELATED DEVICES, SYSTEMS, AND METHODS

CROSS-REFERENCE TO RELATED APPLICATIONS

This application claims the benefit of the priority date of U.S. Provisional Patent Application No. 63/134,906, filed Jan. 7, 2021, and titled "LAYOUTS FOR PADS AND CONDUCTIVE LINES OF MEMORY DEVICES, AND RELATED DEVICES, SYSTEMS, AND METHODS," the disclosure of which is incorporated herein in its entirety by this reference.

TECHNICAL FIELD

Embodiments of the disclosure relate to memory devices. More specifically, various embodiments relate to one or more layouts for pads and/or conductive lines of memory devices, and to related methods, devices, and systems.

BACKGROUND

Memory devices are typically provided as internal, semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), and Flash memory.

A memory device may include multiple memory cells and multiple metal layers including conductive lines arranged above the memory cells. The conductive lines may be configured to provide power to the multiple memory cells. The conductive lines may be electrically coupled to bond pads for receiving power from an external source. Additionally, the conductive lines may be electrically coupled to probe pads to which a probe may be electrically coupled to test the memory device.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
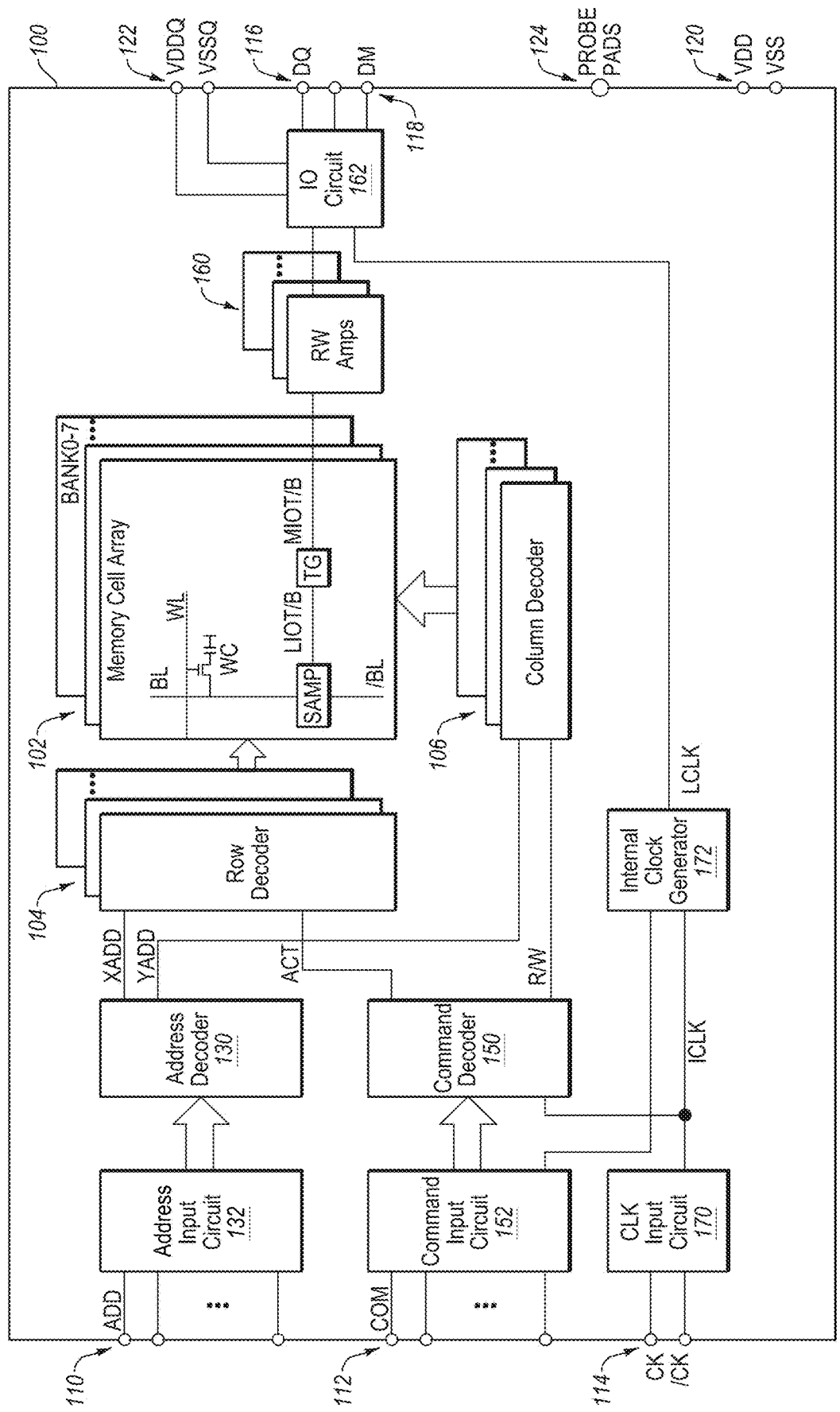
FIG. 1 is a block diagram illustrating an example memory device, in accordance with at least one embodiment of the present disclosure.

A combo die may be a portion of a memory device, e.g., a combo die may include one or more memory cells arranged in one or more layers on a die. The combo die may be included in and/or function as a one-channel memory device (e.g., including one channel of a full memory size (e.g., 16G)) or a two-channel memory device (e.g., including two channels each having a half memory size (e.g., 8G)) depending on the metal layers (e.g., redistribution layers) arranged above the combo die. For example, it may be possible to fabricate a one-channel memory device by forming metal layers in a first layout above a combo die. It may also be possible to fabricate a two-channel memory device by forming metal layers in a second layout above an identical combo die.

To simplify testing operations and/or the cost of testing equipment, it may be advantageous to configure metal layers of a one-channel memory device such that a single probe can be used to test either the one-channel memory device including a combo die or a two-channel memory device including an identical combo die. Some embodiments of the present disclosure include layouts for one or more metal layers of one-channel memory devices that allow the one-channel memory devices to be tested using a probe that can also test a two-channel memory device.

Some embodiments of the present disclosure include layouts of lines, bond pads, and probe pads. Some of the layouts include probe pads at both a first side and a second side of the memory device. Including probe pads at both sides of the memory device may allow a probe to test various embodiments disclosed herein (e.g., one-channel memory devices) as well as two-channel memory devices.

Additionally, some of the layouts include one or more conductive lines (e.g., "inter-pad conductive lines") that may be electrically coupled to probe pads on both sides of the memory device. Such a conductive line may provide for better electrical coupling between the conductive line and a probe, which may allow for improved testing and/or performance of the memory device (e.g., by decreasing the electrical impedance of the inter-pad conductive line).

Additionally, some embodiments of the present disclosure relate to devices that include one or more conductive lines (e.g., "inter-line conductive lines") that provide electrical coupling between various conductive lines of metal layers of a memory device. Such conductive lines may decrease an overall electrical impedance of the metal layers. In some embodiments, conductive lines may be in a channel region of the lines. For example, in a one-channel memory device, there may be no bond pads in a channel-B region of the one-channel memory device and the conductive lines may be arranged in the channel-B region. In some embodiments, some of the conductive lines may be in the same layer as other conductive lines of the various conductive lines of the metal layers. In these or other embodiments, some of the conductive lines may be in a lower layer of the metal layers.

Although various embodiments are described herein with reference to memory devices, the present disclosure is not so limited, and the embodiments may be generally applicable to microelectronic systems and/or semiconductor devices that may or may not include memory devices. Embodiments of the present disclosure will now be explained with reference to the accompanying drawings.

FIG. 1 is a functional block diagram illustrating an example memory device 100, in accordance with at least one embodiment of the present disclosure. Memory device 100 may include, for example, a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random access memory) or a three-dimensional (3D) DRAM. Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or /BL.

Memory device 100 may be generally configured to be receive various inputs (e.g., from an external controller or host) via various terminals, such as address terminals 110, command terminals 112, clock terminals 114, data terminals 116, and data mask terminals 118. Memory device 100 may include additional terminals, for example, power terminals including power supply terminals 120 and power supply terminals 122. Additionally, memory device 100 may include probe pads 124 that may be configured to allow for connection between memory device 100 and a probe that may be configured to test memory device 100.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, an input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by row address XADD and column address YADD.

Clock signals CK and /CK may be received via clock terminals 114. A CLK Input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Figure 2:
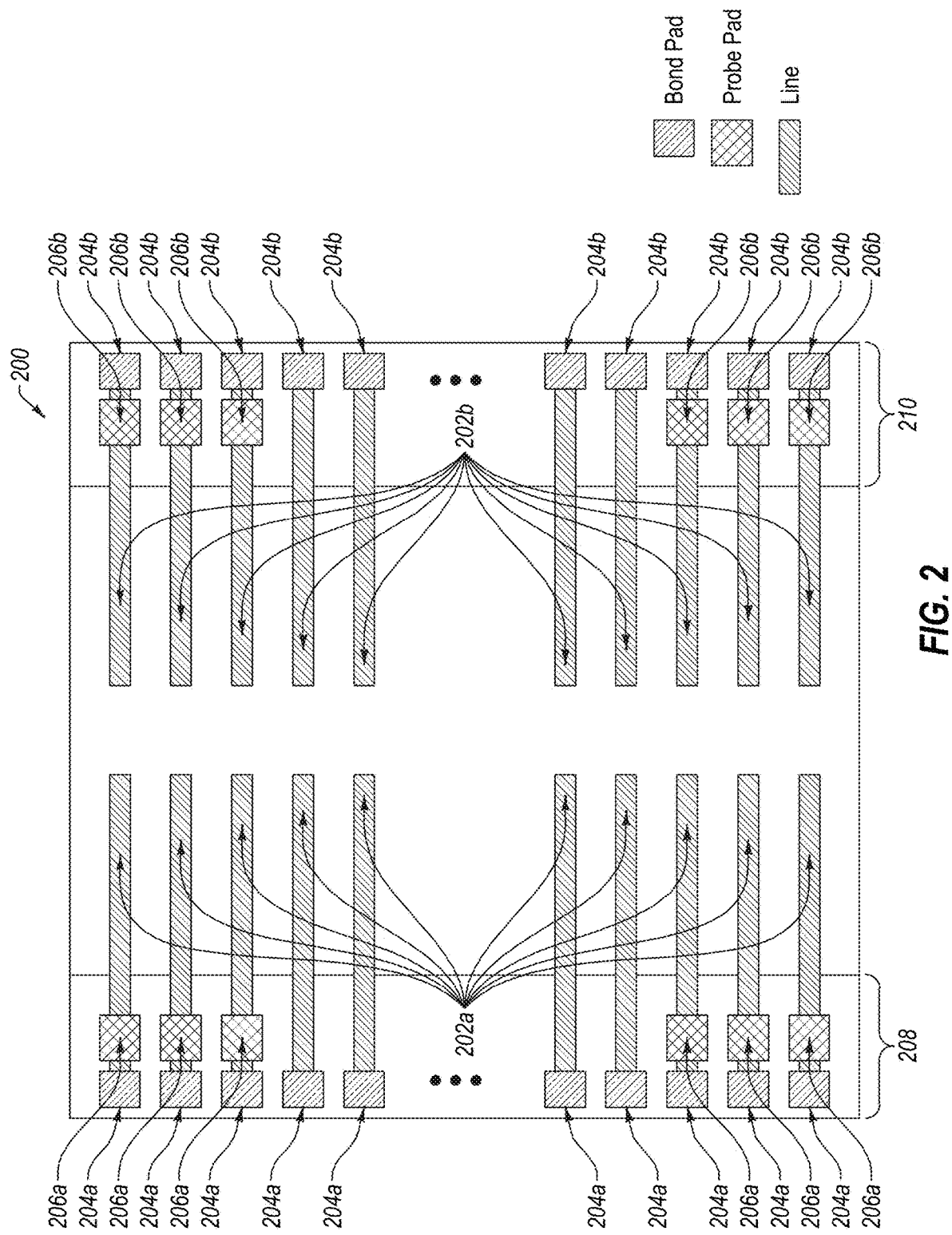
FIG. 2 is a functional block diagram illustrating an example layout of a two-channel memory device.

FIG. 2 is a functional block diagram illustrating an example layout 200 including lines 202 (collectively referring to lines 202a and 202b), bond pads 204 (collectively referring to bond pads 204a and 204b), and probe pads 206 (collectively referring to probe pads 206a and 206b). Layout 200 may be implemented in a memory device, e.g., memory device 100 of FIG. 1. Lines 202 may be part of one or more redistribution layers, the one or more redistribution layers may be configured to redistribute signals and/or power between terminals and/or pads (e.g., data terminals 116, power supply terminals 120, power supply terminals 122, and probe pads 124 all of FIG. 1) and other elements of the memory device (e.g., cells of memory array 102, sense amplifiers, transfer gates, row decoders 104, column decoders 106, and/or read/write amplifiers 160 of FIG. 1).

Lines 202 may be conductive lines arranged in a metal layer. Bond pads 204 and probe pads 206 may be arranged, for example, in the metal layer and may be electrically coupled to lines 202. For example, the lines 202 may be covered by a passivation film (e.g., polyimide), however, the bond pads 204 and/or probe pads 206 may be exposed (e.g., having an opening in the passivation film). Elements described herein may include multiple instances of the same or similar element. These elements may be generically indicated by a numerical designator (e.g., 202) and specifically indicated by the numerical indicator followed by an alphabetic designator (e.g., 202a). For example, lines 202 includes lines 202a extending substantially from a first side of the memory device to a middle portion of the memory device and lines 202b extending substantially from a second side of the memory device to the middle portion of the memory device. Bond pads 204 include bond pads 204a arranged in a channel-A region 208 and bond pads 204b arranged in a channel-B region 210. Probe pads 206 include probe pads 206a arranged in channel-A region 208 and probe pads 206b arranged in channel-B region 210.

Bond pads 204 may be configured to receive power and allow for electrical coupling between lines 202 and a power source. Bond pads 204 may be examples of power supply terminals 120 and/or power supply terminals 122 of FIG. 1. Bond pads 204 may be configured to be electrically coupled to voltage lines, e.g., one or more $V_{DD}$ lines, or one or more $V_{SS}$ lines.

Lines 202 may be configured to provide power to memory cells (e.g., memory cells of memory array 102 of FIG. 1) and/or other elements of the memory device (e.g., row decoders 104, column decoders 106, and/or read/write amplifiers 160 of FIG. 1). In particular, lines 202 may be configured to provide power from bond pads 204 to elements of the memory device by selectively electrically coupling the word lines, bit lines, sense amplifiers and/or transfer gates to bond pads 204.

There may be various additional lines in various additional layers (not illustrated) between lines 202 and the memory cells. For example, lines 202 may be arranged in an uppermost metal layer and there may be one or more metal layers between lines 202 and the memory cells. The additional lines may be for further distributing power, e.g., from the lines 202 to individual elements of the memory device. Further, the additional lines may be for communicating signals e.g., data signals to and from the memory cells. Additionally, there may be additional input/output pads (not illustrated) for providing for data inputs and/or outputs (e.g., any or all of as address terminals 110, command terminals 112, clock terminals 114, data terminals 116, and data mask terminals 118 of FIG. 1).

Probe pads 206 may be configured to allow for electrical coupling between the lines and a probe, which may be used to test the memory device. Contact points of the probe may be arranged to correspond to the arrangement of probe pads 206. The probe pads may be configured to receive power from a probe, e.g., during a testing operation.

In FIG. 2, twenty lines 202 are illustrated for illustrative purposes. Similarly, twenty bond pads 204 are illustrated in FIG. 2 for illustrative purposes. Similarly, twelve probe pads 206 are illustrated in FIG. 2 for illustrative purposes. However, these illustrations are non-limiting, and systems and devices of the present disclosure may include any number of lines, bond pads, and/or probe pads.

Figure 3:
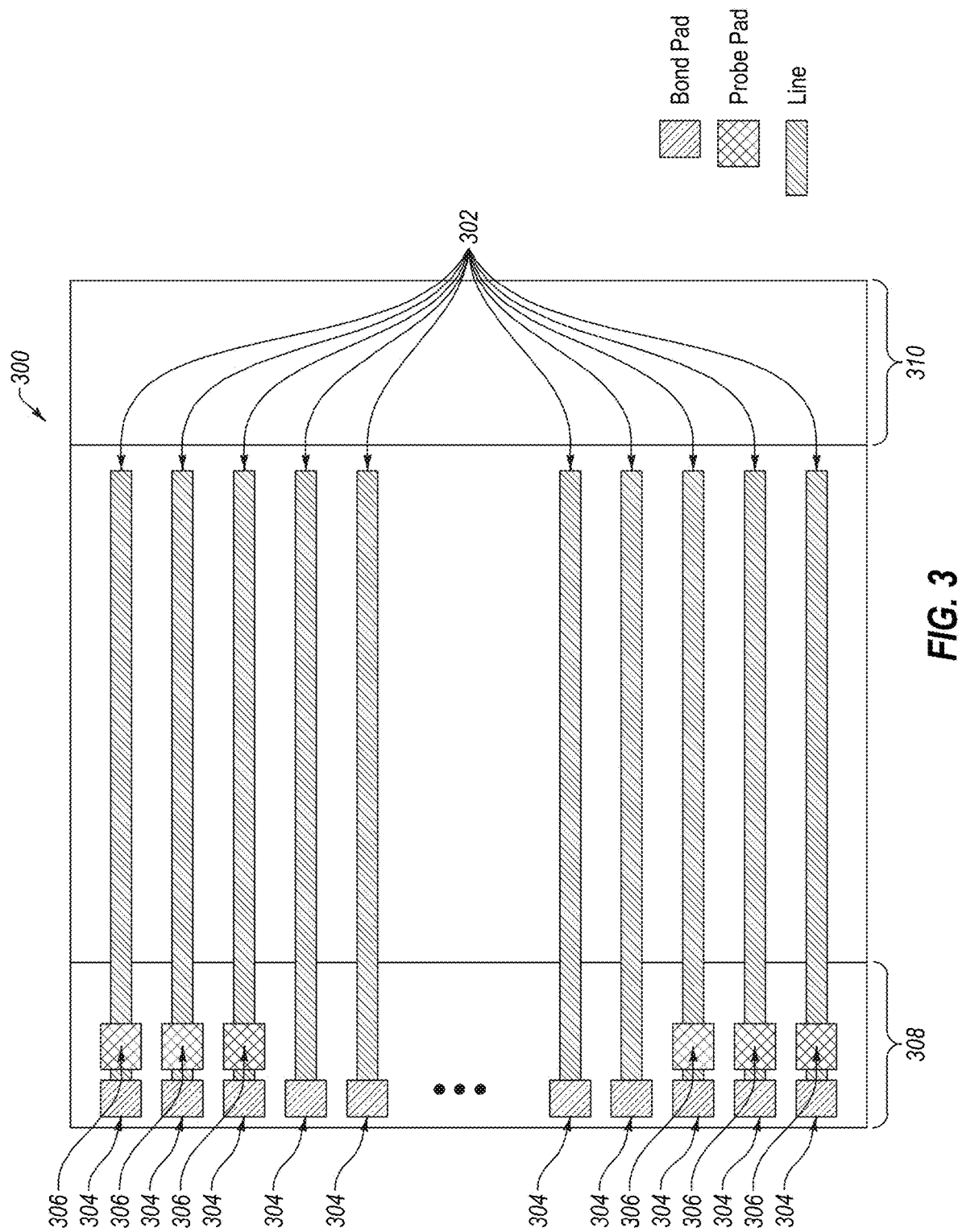
FIG. 3 is a functional block diagram illustrating an example layout of a one-channel memory device.

FIG. 3 is a functional block diagram illustrating another example layout 300 including lines 302, bond pads 304, and probe pads 306. Layout 300 may be implemented in a memory device, e.g., memory device 100 of FIG. 1. Lines 302 may be part of one or more redistribution layers, the one or more redistribution layers may be configured to redistribute signals and/or power between terminals and/or pads and other elements of the memory device.

Lines 302 may be conductive lines arranged in a metal layer. Bond pads 304 and probe pads 306 may be arranged, for example, in the metal layer and may be electrically coupled to lines 302. Lines 302 extend substantially from a first side of the memory device to substantially a second side of the memory device. Bond pads 304 and probe pads 306 are arranged in a channel-A region 308.

Bond pads 304 may be the same as or substantially similar to bond pads 204 of FIG. 2. Probe pads 306 may be the same as or substantially similar to probe pads 206 of FIG. 2.

Lines 302 may be substantially similar to lines 202 of FIG. 2. However, whereas lines 202 extend from substantially a side to a middle portion of a memory device, lines 302 extend from substantially a first side to substantially a second side of a memory device.

In FIG. 3, ten lines 302 are illustrated for illustrative purposes. Similarly, ten bond pads 304 are illustrated in FIG. 3 for illustrative purposes. Similarly, six probe pads 306 are illustrated in FIG. 3 for illustrative purposes. However, these illustrations are non-limiting, and systems and devices of the present disclosure may include any number of lines, bond pads, and/or probe pads.

Layout 200 of FIG. 2 includes components for electrical coupling on two opposing sides of a memory device, i.e., channel-A region 208 and channel-B region 210. In particular, layout 200 of FIG. 2 includes bond pads 204a and probe pads 206a in channel-A region 208 and bond pads 204b and probe pads 206b in channel-B region 210. A memory device including elements arranged according to layout 200, e.g., including lines 202, bond pads 204 and probe pads 206 as arranged in FIG. 2, may be a two-channel memory device.

In contrast, layout 300 of FIG. 3 includes components for electrical coupling on only one side of a memory device, i.e., channel-A region 308. In particular, layout 300 of FIG. 3 includes bond pads 304 and probe pads 306 in channel-A region 308 and does not include components for electrical coupling in a channel-B region 310. A memory device including elements arranged according to layout 300, e.g., including lines 302, bond pads 304, and probe pads 306 as arranged in FIG. 3, may be a one-channel memory device.

Layout 200, including lines 202, bond pads 204, and probe pads 206 (of FIG. 2) may be configured to be implemented above memory cells of a memory device with a particular layout. Further, layout 300, including lines 302, bond pads 304, and probe pads 306 (of FIG. 3) may be configured to be implemented above memory cells with the particular layout. In other words, a redistribution layer including lines, bond pads and probe pads may be arranged above memory cells of a memory device with the particular layout according to either of layout 200 or layout 300. A memory die according to the particular layout may be a combo die. A combo die functions as and/or may be part of a two-channel memory device e.g., if elements of a redistribution layer are arranged above the combo die according to layout 200. Alternatively, the combo die may function as and/or be part of a one-channel memory device e.g., if elements of a redistribution layer are arranged above the combo die according to layout 200.

As will be appreciated, a probe may be configured to electrically couple to probe pads of a memory device to allow for testing of the memory device. A probe may include multiple electrical contact points that may be arranged according to the probe pads of the memory devices that it is configured to test.

Embodiments of the present disclosure include layouts for elements of a one-channel memory device that may be testable with a probe that is configured for testing a two-channel memory device. In particular, some embodiments of the present disclosure include layouts for metal layers for a one-channel memory device that includes probe pads on two sides (e.g., opposing sides) of the memory device. Such a layout may allow for testing of one-channel memory devices via a probe that is configured to test either two-channel memory devices or one-channel memory devices arranged according to layouts the present disclosure e.g., without reconfiguration of the probe. For example, the electrical contact points of the probe may alternatively contact probe pads in a two-channel memory device or in a one-channel memory device arranged according to a layout of the present disclosure.

Thus, some embodiments of the present disclosure provide improvements over existing layouts by providing layouts that allows for testing a one-channel memory device with a probe that is configured for testing a two-channel memory device. Accordingly, embodiments of the present disclosure may provide for improvements in production and testing of memory devices and/or reduce the cost of testing equipment. The layouts described herein may have additional advantages e.g., over other one-channel layouts. Some of the additional advantages are described below.

Figure 4:
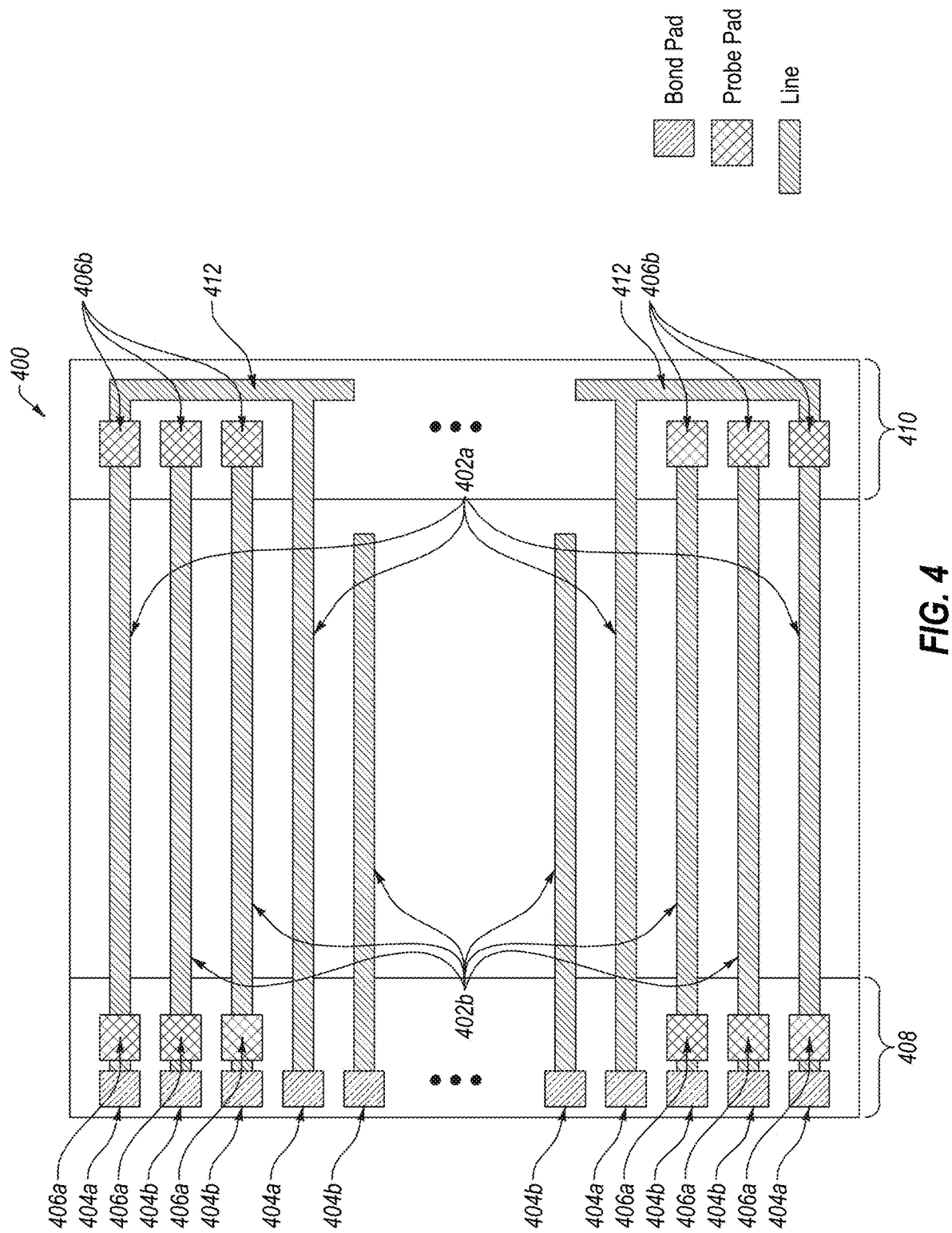
FIG. 4 is a functional block diagram illustrating an example layout of a one-channel memory device according to at least one embodiment of the present disclosure.

FIG. 4 is a functional block diagram illustrating an example layout 400 including lines 402 (collectively referring to lines 402*a* and 402*b*), bond pads 404 (collectively referring to bond pads 404*a* and 404*b*), and probe pads 406 (collectively referring to probe pads 406*a* and 406*b*), of a one-channel memory device according to at least one embodiment of the present disclosure. Layout 400 may be implemented in a memory device, e.g., memory device 100 of FIG. 1. Lines 402 and line portions 412 may be part of one or more redistribution layers, the one or more redistribution layers may be configured to redistribute signals and/or power between terminals and/or pads and other elements of a memory device (e.g., memory device 100 of FIG. 1).

Lines 402 may be conductive lines arranged in a metal layer. Bond pads 404 and probe pads 406 may be arranged, for example, in the metal layer and may be electrically coupled to lines 402. Lines 402 extend substantially from a first side of the memory device to substantially a second side of the memory device. Bond pads 404 are arranged in a channel-A region 408. Probe pads 406*a* are arranged in channel-A region 408 and probe pads 406*b* are arranged in a channel-B region 410.

Bond pads 404 may be the same as or substantially similar to bond pads 204 of FIG. 2. Probe pads 406 may be the same as or substantially similar to probe pads 206 of FIG. 2. Lines 402 may be substantially similar to lines 302 of FIG. 3.

However, unlike layout 300 of FIG. 3, lines 402 of layout 400 are electrically coupled to probe pads 406*a* in channel-A region 408 and probe pads 406*b* in channel-B region 410. One advantage of a one-channel memory device including probe pads 406*b* in channel-B region 410 is that probe pads 406*b* allow the same probe to be used to test a one-channel device (e.g., including layout 400 of FIG. 4) and a two-channel device. For example, the same probe may be used (e.g., without reconfiguring the probe) to test a two-channel memory device e.g., including lines 202 and probe pads 206 according to layout 200 of FIG. 2, and a one-channel memory device e.g., including lines 402 and probe pads 406 according to layout 400 of FIG. 4.

Another advantage of including probe pads 406*b* in channel-B region 410 is that doing so may improve the electrical coupling of lines 402 to a probe. The improved electrical coupling between lines 402 and the probe may result in lower electrical impedance in the metal layer and decreased capacitive effects in lines 402 (including e.g., decreased charging time of lines 402) e.g., during testing operations. For example, absent the probe pads 406*b*, e.g., as in layout 300 of FIG. 3, the impedance of the lines 302 of FIG. 3 between the near-side (e.g., near the channel-A region 308) and the far-side (e.g., near the channel-B region 310) as seen at the probe pads 306 may be larger than the impedance of the lines 402 as seen at the probe pads 406*a* and 406*b*. The impedance between the near-side and the far-side of the lines 302 may result in a voltage drop and/or delay in charging of the lines 302. The lines 402, including the probe pads 406*a* and probe pads 406*b* may have lower impedance than the lines 302 which may result in a lower voltage drop and/or less delay in charging of the lines 402 compared to the lines 302.

Additionally, layout 400 includes line portions 412 that may be configured to electrically couple two or more of lines 402. In particular, line portions 412 may electrically couple lines 402*a*, which may both be configured to be electrically coupled to voltage lines having the same voltage. For example, bond pads 404*a* (which may be electrically coupled to lines 402*a*) may be configured to be electrically coupled to a particular voltage line, e.g., $V_{DD2}$. The electrical coupling of lines 402*a* by line portions 412 may result in decreased electrical impedance for lines 402*a* (which may include all of the lines configured to be coupled to the particular voltage line e.g., $V_{DD2}$). Thus, by decreasing electrical impedance in the metal layers, line portions 412 may represent an improvement over at least some other layouts.

Line portions 412 may be the same conductive material as lines 402. Further, line portions 412 may be arranged in the same metal layer as lines 402. Line portions 412 may be arranged in channel-B region 410. Layout 400 may not include bond pads in channel-B region 410, which may leave available space in metal layers in channel-B region 410. In particular, because there are no bond pads (and no lines for electrically coupling to bond pads) in channel-B region 410, there may be space available in channel-B region 410 for line portions 412.

In FIG. 4, ten lines 402 are illustrated for illustrative purposes. Similarly, ten bond pads 404 are illustrated in FIG. 4 for illustrative purposes. Similarly, twelve probe pads 406 are illustrated in FIG. 4 for illustrative purposes. However, these illustrations are non-limiting, and systems and devices of the present disclosure may include any number of lines, bond pads, and/or probe pads. Further, line portions 412 may be configured to electrically couple any number of lines 402.

Figure 5:
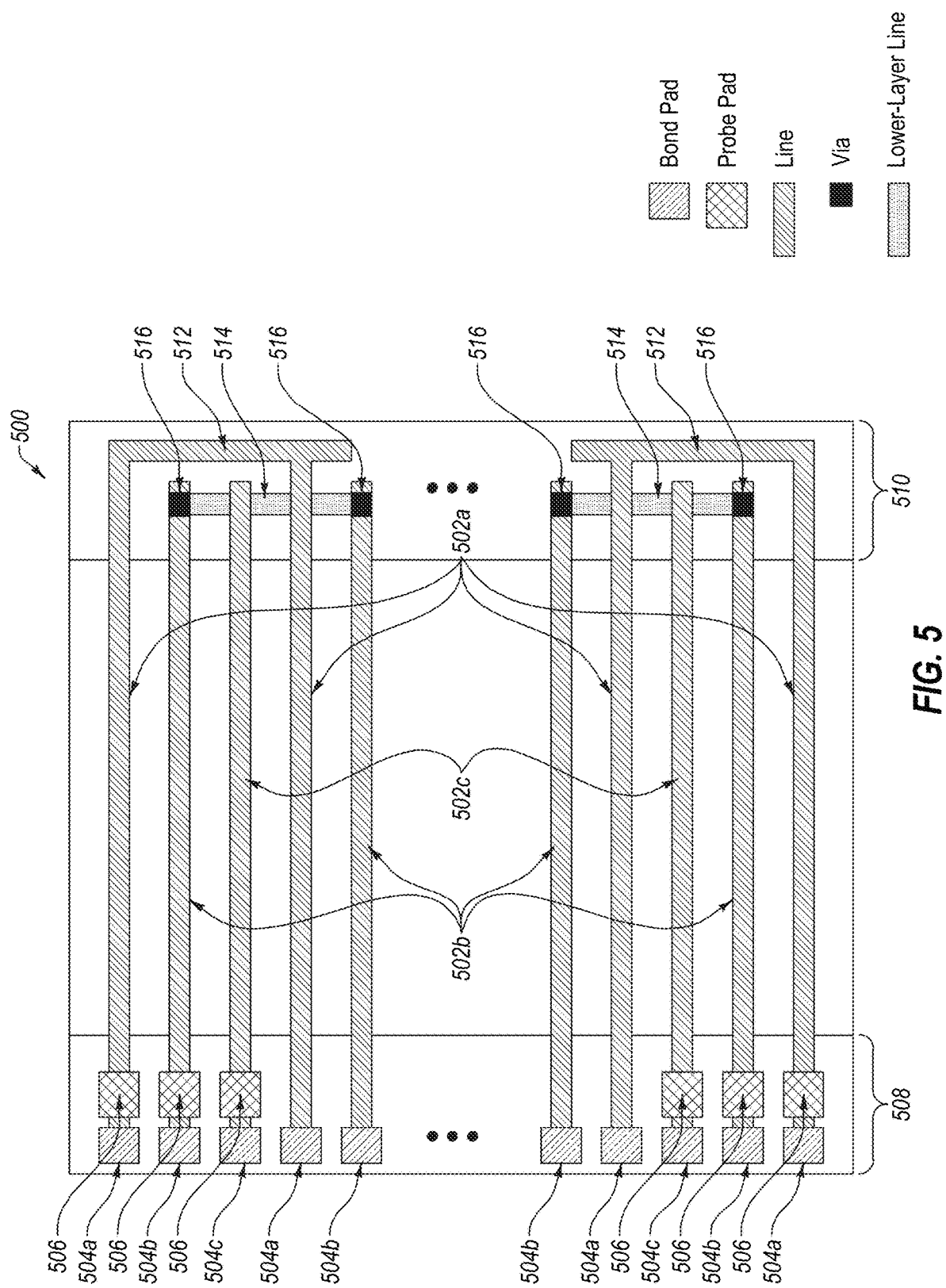
FIG. 5 is a functional block diagram illustrating another example layout of a one-channel memory device according to at least one embodiment of the present disclosure.

FIG. 5 is a functional block diagram illustrating an example layout 500 including lines 502 (collectively referring to lines 502*a*, 502*b*, and 502*c*), bond pads 504 (collectively referring to bond pads 504*a*, 504*b*, and 504*c*), and probe pads 506, for a one-channel memory device according to at least one embodiment of the present disclosure. Layout 500 may be implemented in a memory device, e.g., memory device 100 of FIG. 1. Lines 502, line portions 512, and lower-layer lines 514 may be part of one or more redistribution layers, the one or more redistribution layers may be configured to redistribute signals and/or power between terminals and/or pads and other elements of the memory device (e.g., memory device 100 of FIG. 1).

Lines 502 may be conductive lines arranged in a metal layer. Bond pads 504 and probe pads 506 may be arranged, for example, in the metal layers and may be electrically coupled to lines 502. Lines 502 extend from substantially a first side of the memory device to substantially a second side of the memory device. Bond pads 504 and probe pads 506 are arranged in a channel-A region 508.

Bond pads 504 may be the same as or substantially similar to bond pads 204 of FIG. 2. Probe pads 506 may be the same as or substantially similar to probe pads 206 of FIG. 2. Lines 502 may be substantially similar to lines 402 of FIG. 4. Line portions 512 may be the same as or substantially similar to line portions 412 of FIG. 4.

Additionally, layout 500 includes lower-layer lines 514 that may be configured to electrically couple two or more of lines 502. In particular, lower-layer lines 514 may electrically couple lines 502b that may both be configured to be electrically coupled to voltage lines having the same voltage. For example, bond pads 504b (which may be electrically coupled to lines 502b) may be configured to be electrically coupled to a particular voltage line, e.g., $V_{SS}$. The electrical coupling of lines 502b by lower-layer lines 514 may result in decreased electrical impedance for lines 502b (which may include all of the lines configured to be coupled to the particular voltage line e.g., $V_{SS}$). Thus, by decreasing electrical impedance in the metal layers, lower-layer lines 514 may represent an improvement over at least some other metal-layer layouts.

Lower-layer lines 514 may be the same conductive material as lines 502. Lower-layer lines 514 may be in a metal layer (e.g., below lines 502) and may be electrically coupled to lines 502 through vias 516.

Lower-layer lines 514 may be arranged in channel-B region 510. The layout of FIG. 5 may not include bond pads in channel-B region 510, which may leave available space in metal layers in channel-B region 510. In particular, because there are no bond pads (and no lines for electrically coupling to bond pads) in channel-B region 510, there may be space available in channel-B region 510 for lower-layer lines 514.

In FIG. 5, ten lines 502 are illustrated for illustrative purposes. Similarly, ten bond pads 504 are illustrated in FIG. 5 for illustrative purposes. Similarly, six probe pads 506 are illustrated in FIG. 5 for illustrative purposes. However, these illustrations are non-limiting, and systems and devices of the present disclosure may include any number of lines, bond pads, and/or probe pads. Further, each of line portions 512 and lower-layer lines 514 may be configured to electrically couple any number of lines 502.

Figure 6:
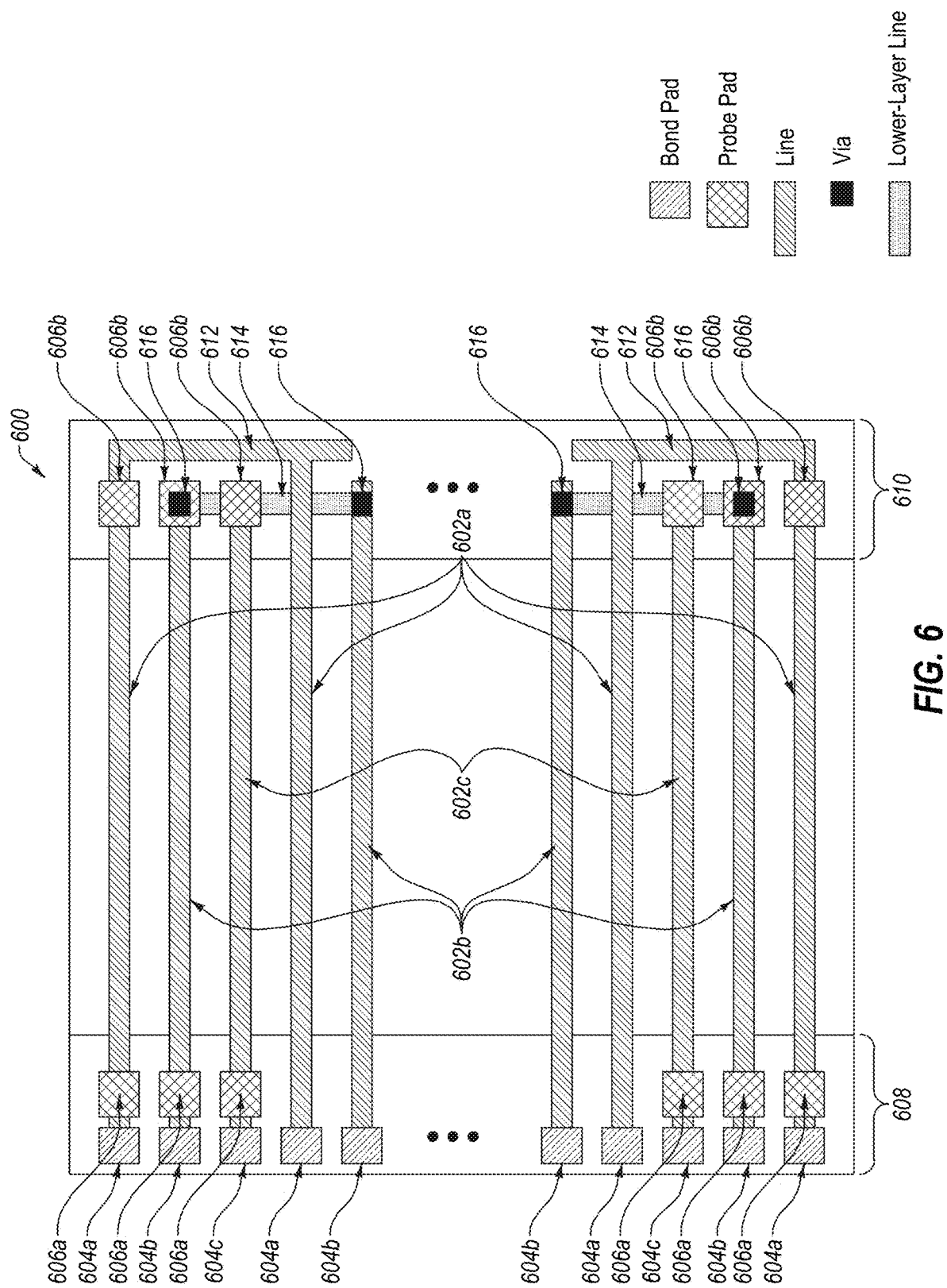
FIG. 6 is a functional block diagram illustrating yet another example layout of a one-channel memory device according to at least one embodiment of the present disclosure.

FIG. 6 is a functional block diagram illustrating an example layout 600 including lines 602 (collectively referring to lines 602a, 602b, and 602c), bond pads 604 (collectively referring to bond pads 604a, 604b, and 604c), and probe pads 606 (collectively referring to probe pads 606a and 606b), for a one-channel memory device according to at least one embodiment of the present disclosure. Layout 600 may be implemented in a memory device, e.g., memory device 100 of FIG. 1. Lines 602, line portions 612, and lower-layer lines 614 may be part of one or more redistribution layers, the one or more redistribution layers may be configured to redistribute signals and/or power between terminals and/or pads and other elements of the memory device (e.g., memory device 100 of FIG. 1).

Lines 602 may be conductive lines arranged in a metal layer. Bond pads 604 and probe pads 606 may be arranged, for example, in the metal layer and may be electrically coupled to lines 602. Lines 602 extend from substantially a first side of the memory device to substantially a second side of the memory device. Bond pads 604 are arranged in a channel-A region 608. Similar to what was described with regard to probe pads 406a and probe pads 406b of FIG. 4, probe pads 606a are arranged in channel-A region 608 and probe pads 606b are arranged in a channel-B region 610.

Bond pads 604 may be the same as or substantially similar to bond pads 204 of FIG. 2. Probe pads 606 may be the same as or substantially similar to probe pads 206 of FIG. 2. Lines 602 may be substantially similar to lines 402 of FIG. 4. Line portions 612 may be the same as or substantially similar to line portions 412 of FIG. 4. Lower-layer lines 614 may be the same as or substantially similar to lower-layer lines 514 of FIG. 5. Vias 616 may be the same as or substantially similar to vias 516 of FIG. 5.

Layout 600, including probe pads 606b, line portions 612, and lower-layer lines 614, may exhibit the advantages described above with regard to probe pads 406b of FIG. 4, line portions 412 of layout 400 of FIG. 4, and lower-layer lines 514 of layout 500 of FIG. 5. In particular, it may be possible to test a memory device arranged according to layout 600 with a probe that is also configured to test a two-channel memory device (e.g., a device arranged according to the layout of FIG. 2) as a result of probe pads 606b. Additionally, lines 602b may have better electrical coupling to a power source as a result of probe pads 606b. Additionally, the lines according to layout 600 may exhibit lower electrical impedance at lines 602a as a result of line portions 612. Additionally, lines according to layout 600 may exhibit lower electrical impedance at lines 602b as a result of lower-layer lines 614.

In FIG. 6, ten lines 602 are illustrated for illustrative purposes. Similarly, ten bond pads 604 are illustrated in FIG. 6 for illustrative purposes. Similarly, twelve probe pads 606 are illustrated in FIG. 6 for illustrative purposes. However, these illustrations are non-limiting, and systems and devices of the present disclosure may include any number of lines, bond pads, and/or probe pads. Further, each of line portions 612 and lower-layer lines 614 may be configured to electrically couple any number of lines 602.

Figure 7:
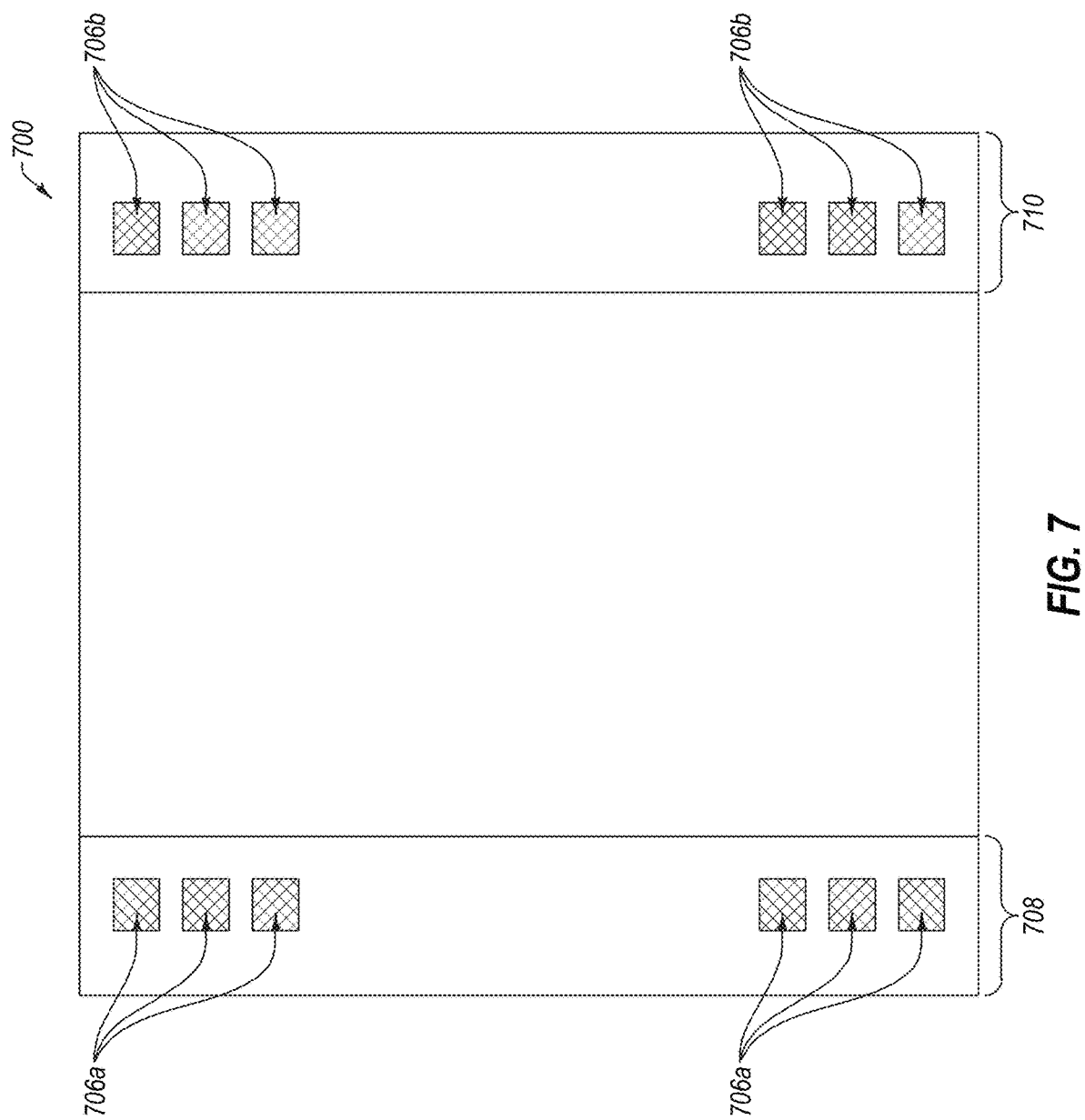
FIG. 7 is a functional block diagram illustrating an example layout of contact points of a probe that may be used to test a memory device according to at least one embodiment of the present disclosure.

FIG. 7 is a functional block diagram illustrating a layout of contact points of a probe 700 that may be used to test a memory device according to at least one embodiment of the present disclosure. Probe 700 includes testing contact points 706a are arranged in a channel-A region 708 and testing contact points 706b are arranged in a channel-B region 710.

Testing contact points 706 may be configured to provide power from probe 700 to a memory device, e.g., during testing operations. Testing contact points 706 may be arranged to electrically couple to any of probe pads 306 of layout 300 of FIG. 3, probe pads 406 of layout 400 of FIG. 4 and/or probe pads 606 of layout 600 of FIG. 6. In particular, the arrangement of testing contact points 706 on probe 700 may mirror the arrangement of any or all of probe pads 406 in layout 400 of FIG. 4 and/or probe pads 606 in layout 600 of FIG. 6.

Additionally, in some embodiments, although not illustrated, probe 700 may include one or more input/output contact points arranged to electrically couple to other pads of the memory device, e.g., input/output pads (e.g., any or all of as address terminals 110, command terminals 112, clock terminals 114, data terminals 116, and data mask terminals 118 of FIG. 1). Probe 700 may be configured to provide and/or receive testing signals e.g., data inputs and outputs, from a memory device through the input/output contact points.

Additionally, in some embodiments, although not illustrated, probe 700 may include one or more contact points for an internal power supply. The internal power supply may include one or more lines or components configured to regulate and/or distribute power within the memory device. The probe 700 may be configured to provide power to a memory device being tested through the contact points for the internal power supply as part of a testing operation. Additionally, the probe 700 may be configured to observe voltage and/or current at the contact points for internal power supply as part of a testing operation.

Figure 8A:
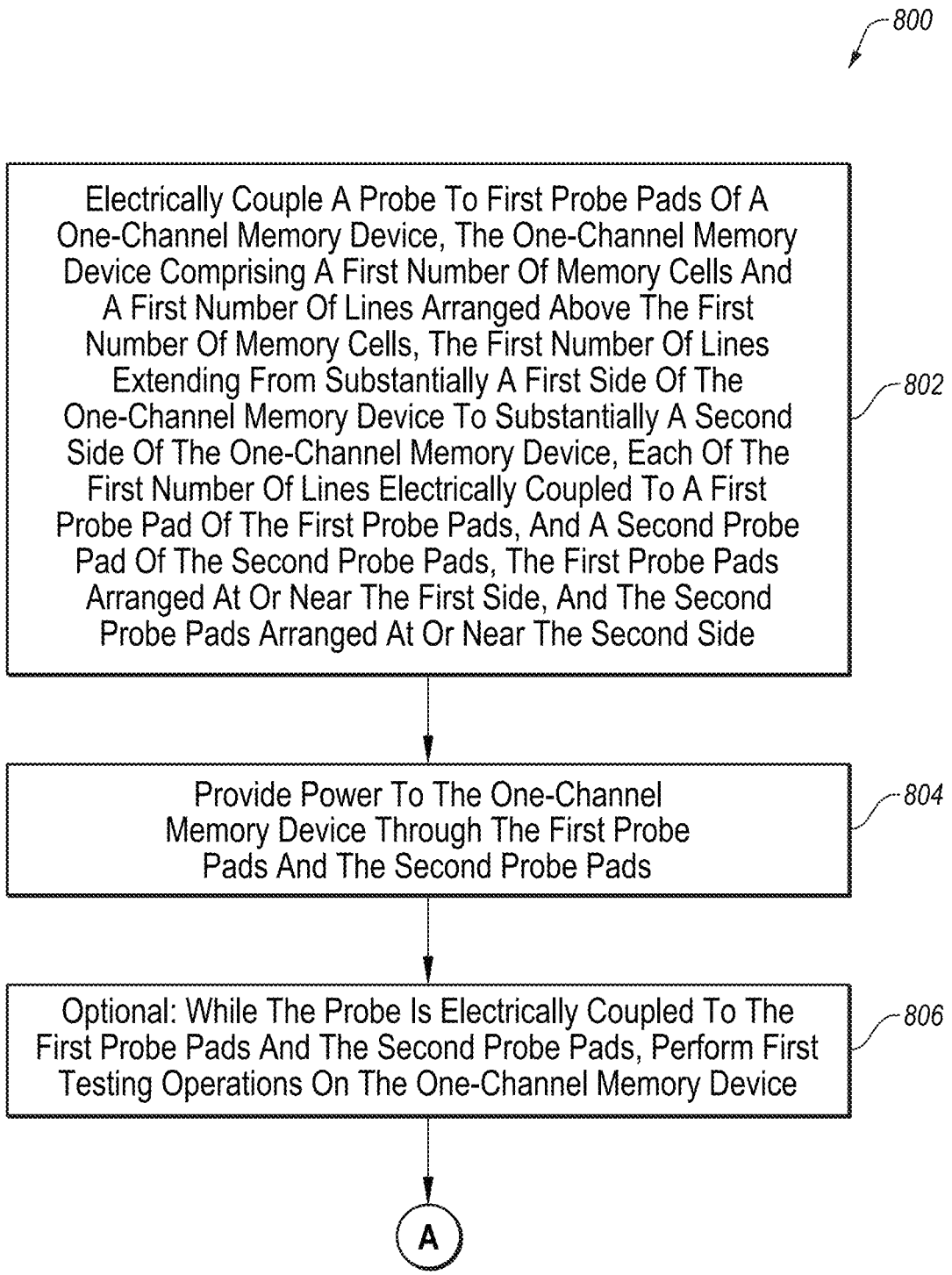
FIGS. 8A and 8B, collectively, are a flowchart illustrating an example method in accordance with at least one embodiment of the present disclosure.
Figure 8B:
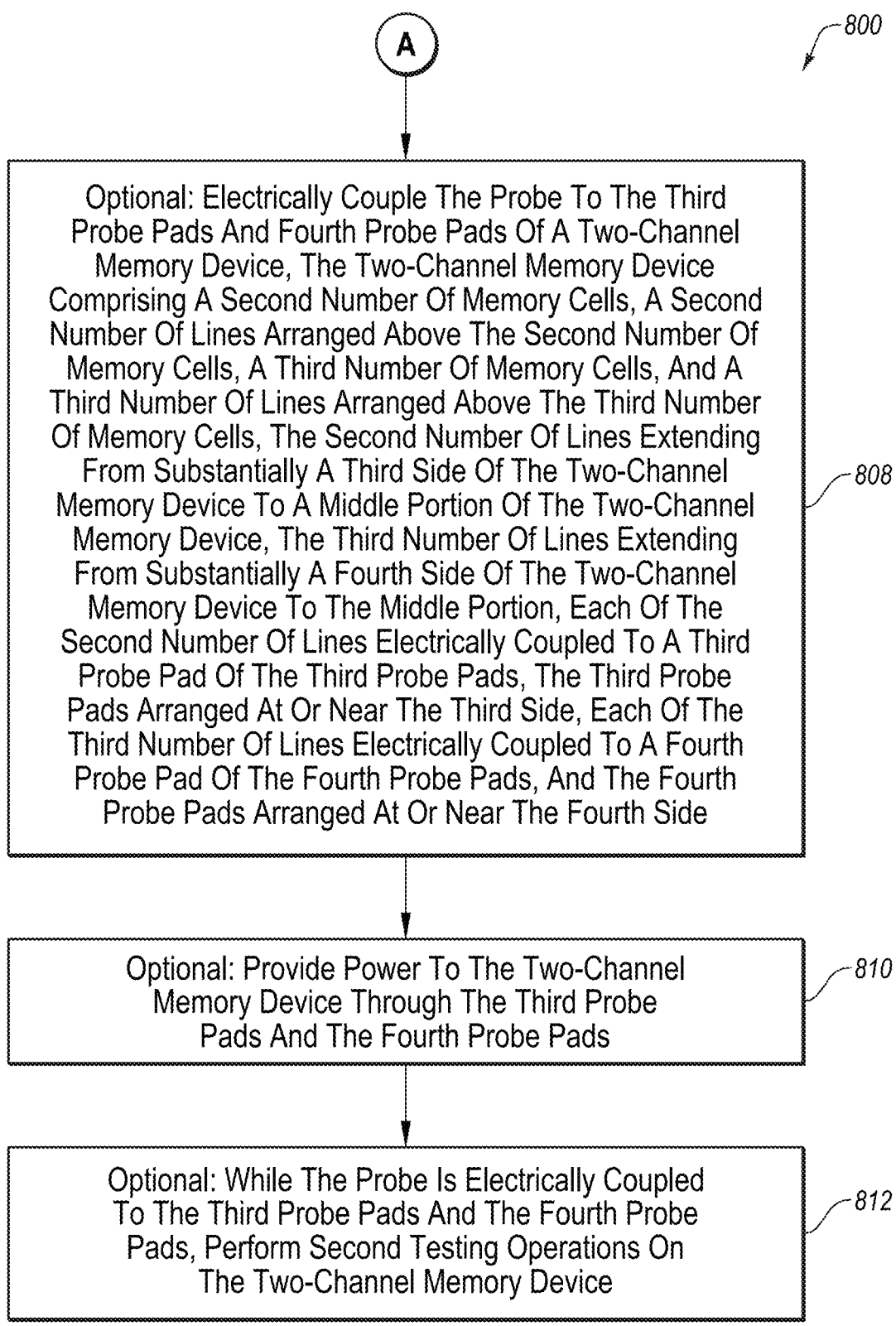

FIGS. 8A and 8B, collectively, are a flowchart illustrating an example method 800 in accordance with at least one embodiment of the present disclosure. Method 800 may be performed, in some embodiments, by a device or system including a probe, e.g., probe 700 of FIG. 7. Method 800 may be performed on a memory device e.g., as memory device 100 of FIG. 1, memory system 900 of FIG. 9, electronic system 1000 of FIG. 10, or another device or system. Method 800 may be performed on a two-channel memory device, e.g., a memory device according to layout 200 of FIG. 2. Additionally, method 800 may be performed on a one-channel memory device, e.g., a memory device according to layout 400 of FIG. 4 or layout 600 of FIG. 6. Although illustrated as discrete blocks, various blocks may be divided into additional blocks, combined into fewer blocks, or eliminated, depending on the desired implementation.

At block 802, a probe may be electrically coupled to first probe pads and second probe pads of a one-channel memory device. The first probe pads may be arranged at or near the first side of the memory device and the second probe pads may be arranged at or near the second side of the memory device. For example, the one-channel memory device may be arranged according to layout 400 of FIG. 4 or layout 600 FIG. 6.

The one-channel memory device may include a first number of memory cells and a first number of lines arranged above the first number of memory cells. The first number of lines may extend from substantially the first side of the one-channel memory device to substantially the second side of the one-channel memory device. Each of the first number of lines may be electrically coupled to a first probe pad of the first probe pads, and a second probe pad of the second probe pads.

At block 804, power may be provided to the one-channel memory device through the first probe pads and the second probe pads. The one or more test signals may be part of, or associated with, testing operations.

For example, at block 806, while the probe is electrically coupled to the first probe pads and the second probe pads, first testing operations may be performed on the one-channel memory device.

Following block 806, the probe may be electrically decoupled from the first probe pads and the second probe pads of the one-channel memory device.

At block 808, the probe may be electrically coupled to third probe pads and fourth probe pads of a two-channel memory device. The third probe pads may be arranged at or near the third side of the two-channel memory device and the fourth probe pads may be arranged at or near the fourth side of the two-channel memory device. For example, the two-channel memory device may be arranged according to layout 200 of FIG. 2.

The two-channel memory device may include a second number of memory cells, a second number of lines arranged above the second number of memory cells, a third number of memory cells, and a third number of lines arranged above the third number of memory cells. The second number of lines may extend from substantially the third side of the two-channel memory device to a middle portion of the two-channel memory device. The third number of lines may extend from substantially the fourth side of the two-channel memory device to the middle portion. Each of the second number of lines may be electrically coupled to a third probe pad of the third probe pads and each of the third number of lines may be electrically coupled to a fourth probe pad of the fourth probe pads.

At block 810, power may be provided to the two-channel memory device through the third probe pads and the fourth probe pads. The one or more test signals may be part of, or associated with, testing operations.

For example, at block 812, while the probe is electrically coupled to the third probe pads and the fourth probe pads, second testing operations may be performed on the two-channel memory device.

Because the first probe pads may be arranged in the same position in the layout of the one-channel memory device as the third probe pads are in the two-channel memory device, and the second probe pads are arranged in the same position in the layout of the one-channel memory device as the fourth probe pads are in the two-channel memory device, the same probe may be used to perform the first testing operations on the one-channel memory device and the second testing operations on the second memory device. Further, the probe may be configured to perform the first testing operations on the one-channel memory device and the two-channel memory device without a need to reconfigure (e.g., rearrange contact points) the probe.

Modifications, additions, or omissions may be made to method 800 without departing from the scope of the present disclosure. Furthermore, the outlined operations and actions are only provided as examples, and some of the operations and actions may be optional, combined into fewer operations and actions, or expanded into additional operations and actions without detracting from the essence of the disclosed embodiment. As examples, any or all of block 806, block 808, block 810, and/or block 812 may be optional. Further still, the operations of method 800 may be implemented in differing order. As an example, block 808, block 810, and block 812 may precede block 802, block 804, and block 806.

Figure 9:
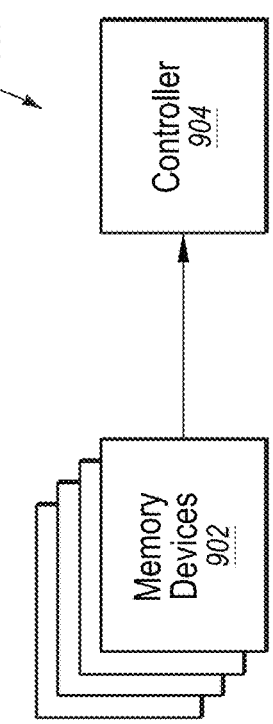
FIG. 9 is a simplified block diagram illustrating an example memory system, in accordance with at least one embodiment of the present disclosure.

FIG. 9 is a simplified block diagram illustrating an example memory system 900 implemented in accordance with at least one embodiment of the present disclosure. Memory system 900, which may include, for example, a semiconductor device, includes a number of memory devices 902 and a controller 904. Controller 904 may be operatively coupled with memory devices 902 so as to convey command/address signals (e.g., command/address signals received by command terminals 112 and/or address terminals 110 of FIG. 1) to memory devices 902.

Memory devices 902 may include lines, bond pads and/or probe pads as described herein. For example, memory devices 902 may include elements arranged according to layout 400 of FIG. 4, layout 500 of FIG. 5, or layout 600 of FIG. 6.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 10:
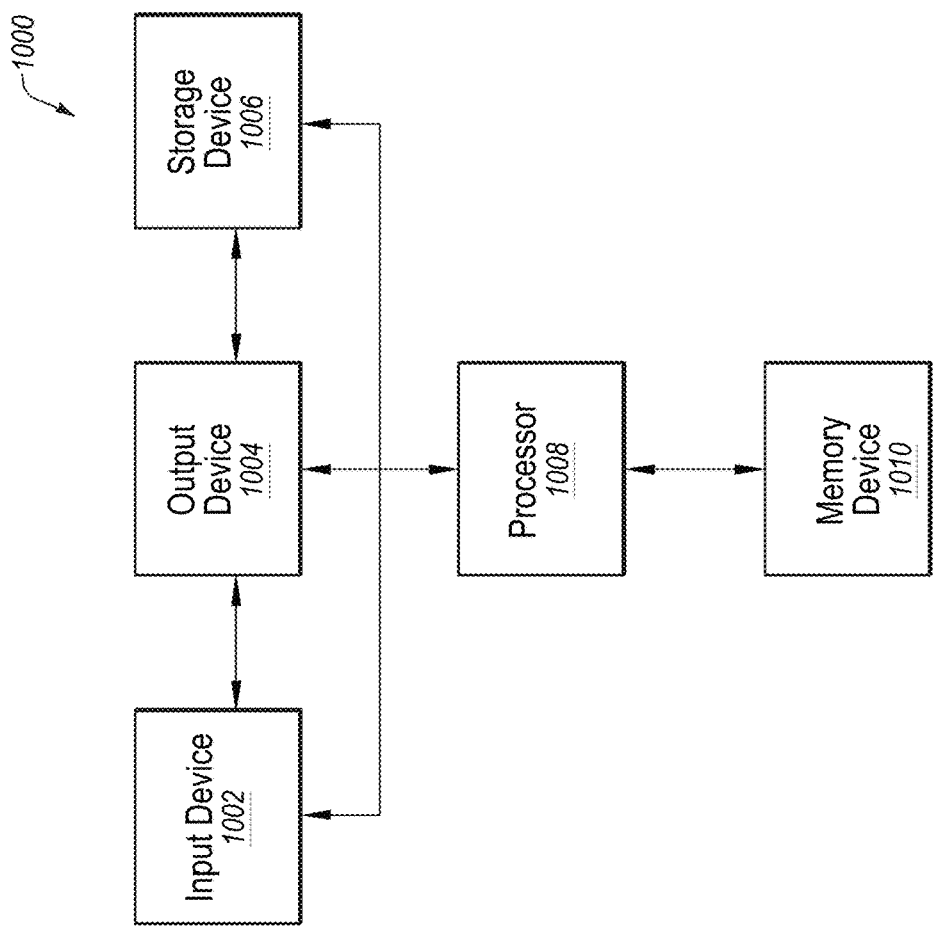
FIG. 10 is a simplified block diagram illustrating an example electronic system, in accordance with at least one embodiment of the present disclosure.

FIG. 10 is a simplified block diagram illustrating an electronic system 1000 implemented in accordance with at least one embodiment of the present disclosure. Electronic system 1000 includes at least one input device 1002, which may include, for example, a keyboard, a mouse, or a touch screen. Electronic system 1000 further includes at least one output device 1004, such as a monitor, a touch screen, or a speaker. Input device 1002 and output device 1004 are not necessarily separable from one another. Electronic system 1000 further includes a storage device 1006. Input device 1002, output device 1004, and storage device 1006 may be coupled to a processor 1008. Electronic system 1000 further includes a memory device 1010 coupled to processor 1008. Memory device 1010 may include at least a portion of memory system 900 of FIG. 9. Electronic system 1000 may include, for example, a computing, processing, industrial, or consumer product. For example, without limitation, electronic system 1000 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Some embodiments of the present disclosure include a memory device including a number of memory cells and a number of conductive lines arranged above the number of memory cells. The number of conductive lines may extend from substantially a first side of the memory device to substantially a second side of the memory device. Each of the number of conductive lines may be electrically coupled to a bond pad, a first probe pad and a second probe pad. The bond pad may be positioned at or near the first side. The bond pad may be configured to receive power. The first probe pad may be positioned at or near the first side. The first probe pad may be configured to be electrically coupled to a probe. The second probe pad may be positioned at or near the second side.

Some embodiments of the present disclosure include a system including: at least one input device, at least one output device, at least one processor device operably coupled to the input device and the output device, and at least one memory device operably coupled to the at least one processor device. The at least one memory device may include a number of memory cells, a first side, a second side opposite the first side, and a metal layer arranged above the number of memory cells. The metal layer may include a number of metal lines extending from substantially the first side to substantially the second side. The number of metal lines may be configured to provide power to the number of memory cells. Each of the number of metal lines may be electrically coupled to: a bond pad, a first probe pad and a second probe pad. The bond pad may be positioned at or near the first side and in the metal layer. The bond pad may be adapted to receive power for the number of memory cells. The first probe pad may be positioned at or near the first side and in the metal layer. The first probe pad may be adapted to provide for electrical coupling to a probe for testing of the number of memory cells. The second probe pad may be positioned at or near the second side in the metal layer. The second probe pad may be adapted to provide for electrical coupling to the probe.

Some embodiments of the present disclosure include a memory device including a number of memory cells and a number of conductive lines. The number of conductive lines may be arranged in a metal layer above the number of memory cells. The number of conductive lines may extend from substantially a first side of the memory device to substantially a second side of the memory device. Each of the number of conductive lines may be electrically coupled to: a bond pad, and a probe pad. The bond pad may be positioned at or near the first side, the bond pad configured to receive power. The probe pad may be positioned at or near the first side. The probe pad may be configured to be electrically coupled to a probe. The memory device may further include a conductive line electrically coupled to at least two of the number of conductive lines. The conductive line may be arranged below the metal layer.

Some embodiments of the present disclosure include a system including: at least one input device, at least one output device, at least one processor device operably coupled to the input device and the output device, and at least one memory device operably coupled to the at least one processor device. The at least one memory device may include: a number of memory cells; a first side; a second side opposite the first side; and a first metal layer arranged above the number of memory cells. The first metal layer may include a number of metal lines extending from substantially the first side to substantially the second side. The number of metal lines may be configured to provide power to the number of memory cells. Each of the number of metal lines may be electrically coupled to a bond pad and a probe pad. The bond pad may be positioned at or near the first side and in the first metal layer. The bond pad may be configured to receive power for the number of memory cells. The probe pad may be positioned at or near the first side and in the first metal layer. The probe pad may be configured to provide for electrical coupling to a probe for testing of the number of memory cells. The at least one memory device may further include a second metal layer arranged below the first metal layer. The second metal layer may include a metal line electrically coupled to at least two of the number of metal lines.

Some embodiments of the present disclosure include a method of testing memory devices. The method may include electrically coupling a probe to first probe pads and second probe pads of a one-channel memory device. The one-channel memory device may include a first number of memory cells and a first number of lines arranged above the first number of memory cells. The first number of lines may extend from substantially a first side of the one-channel memory device to substantially a second side of the one-channel memory device. Each of the first number of lines may be electrically coupled to a first probe pad of the first probe pads and a second probe pad of the second probe pads. The first probe pads may be arranged at or near the first side. The second probe pads may be arranged at or near the second side. The method may also include providing one or more test signals to the one-channel memory device through the first probe pads and the second probe pads.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

Additionally, as used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met. Additionally, as used herein, the term "near" may mean close, adjacent, or proximate in physical separation.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device comprising:
   a number of memory cells; and
   a number of conductive lines arranged in a first metal layer above the number of memory cells,
      the number of conductive lines extending from substantially a first side of the memory device to substantially a second side of the memory device,
      at least two of the number of conductive lines electrically coupled together at or near the second side through a conductive line arranged in a second metal layer below the first metal layer,
      each of the number of conductive lines electrically coupled to:
         a respective bond pad positioned at or near the first side, the bond pads configured to receive power;
         a respective first probe pad positioned at or near the first side, the first probe pads configured to electrically couple to a probe; and
         a respective second probe pad positioned at or near the second side.

2. The memory device of claim 1, wherein the memory device includes bond pads only at or near the first side.

3. The memory device of claim 1, wherein the memory device comprises a one-channel memory device with bond pads positioned only at or near the first side of the memory device.

4. The memory device of claim 1, wherein each of the bond pads, the first probe pads, and the second probe pads are arranged in the same level as the number of conductive lines.

5. The memory device of claim 1, wherein the number of conductive lines are arranged in a single metal layer of the memory device.

6. The memory device of claim 5, wherein the single metal layer is an uppermost metal layer of one or more redistribution layers of the memory device.

7. The memory device of claim 1, wherein the number of conductive lines are arranged in a metal layer, and wherein at least two of the number of conductive lines are electrically coupled together at or near the second side in the metal layer.

8. The memory device of claim 1, wherein at least two other of the number of conductive lines are electrically coupled together at or near the second side in the first metal layer.

9. A system, comprising:
   at least one input device;

at least one output device;
at least one processor device operably coupled to the input device and the output device; and
at least one memory device operably coupled to the at least one processor device, the at least one memory device comprising:
  a number of memory cells;
  a first side;
  a second side opposite the first side; and
  a metal layer arranged above the number of memory cells, the metal layer comprising a number of metal lines extending from substantially the first side to substantially the second side,
    the number of metal lines configured to provide power to the number of memory cells,
    at least two of the number of metal lines electrically coupled together at or near the second side through a metal line arranged in a second metal layer below the metal layer,
    each of the number of metal lines electrically coupled to:
      a respective bond pad positioned at or near the first side and in the metal layer, the bond pads adapted to receive power for the number of memory cells;
      a respective first probe pad positioned at or near the first side and in the metal layer, the first probe pads adapted to provide for electrical coupling to a probe for testing of the number of memory cells; and
      a respective second probe pad positioned at or near the second side and in the metal layer, the second probe pads adapted to provide for electrical coupling to the probe.

10. The system of claim 9, wherein the at least one memory device includes bond pads only at or near the first side.

11. The system of claim 9, wherein the at least one memory device comprises at least one one-channel memory device with bond pads positioned only at or near the first side of the at least one memory device.

12. The system of claim 9, wherein the metal layer is an uppermost metal layer of one or more redistribution layers of the at least one memory device.

13. The system of claim 9, wherein at least two of the number of metal lines are electrically coupled together at or near the second side in the metal layer.

14. The system of claim 9, wherein at least two other of the number of metal lines are electrically coupled together at or near the second side in the metal layer.

15. A memory device comprising:
a number of memory cells;
a number of conductive lines arranged in a metal layer above the number of memory cells, the number of conductive lines extending from substantially a first side of the memory device to substantially a second side of the memory device, each of the number of conductive lines electrically coupled to:
  a respective bond pad positioned at or near the first side, the bond pads configured to receive power; and
  a respective probe pad positioned at or near the first side, the probe pads configured to be electrically coupled to a probe; and
a conductive line electrically coupled to at least two of the number of conductive lines, the conductive line arranged below the metal layer.

16. The memory device of claim 15, wherein the memory device includes bond pads only at or near the first side.

17. The memory device of claim 15, wherein the memory device comprises a one-channel memory device with bond pads positioned only at or near the first side of the memory device.

18. The memory device of claim 15, wherein the metal layer is an uppermost metal layer of one or more redistribution layers of the memory device.

19. The memory device of claim 15, wherein each of the bond pads and the probe pads are arranged in the same level as the metal layer.

20. The memory device of claim 15, wherein another at least two of the number of conductive lines are electrically coupled together at the second side in the metal layer.

21. The memory device of claim 15, wherein the conductive line is arranged in a second metal layer below the metal layer.

22. The memory device of claim 15, wherein the probe pads comprise first probe pads and each of the number of conductive lines is further electrically coupled to a second probe pad at or near the second side.

23. A system, comprising:
at least one input device;
at least one output device;
at least one processor device operably coupled to the input device and the output device; and
at least one memory device operably coupled to the at least one processor device, the at least one memory device comprising:
  a number of memory cells;
  a first side;
  a second side opposite the first side; and
  a first metal layer arranged above the number of memory cells, the first metal layer comprising a number of metal lines extending from substantially the first side to substantially the second side, the number of metal lines configured to provide power to the number of memory cells, each of the number of metal lines electrically coupled to:
    a respective bond pad positioned at or near the first side and in the first metal layer, the bond pads configured to receive power for the number of memory cells; and
    a respective probe pad positioned at or near the first side and in the first metal layer, the probe pads configured to provide for electrical coupling to a probe for testing of the number of memory cells; and
  a second metal layer arranged below the first metal layer, the second metal layer comprising a metal line electrically coupled to at least two of the number of metal lines.

24. The system of claim 23, wherein the at least one memory device includes bond pads only at or near the first side.

25. The system of claim 23, wherein the at least one memory device comprises a one-channel memory device with bond pads positioned only at or near the first side of the at least one memory device.

26. The system of claim 23, wherein the first metal layer is an uppermost metal layer of one or more redistribution layers of the memory device.

27. The system of claim 23, wherein each of the bond pads and the probe pads are arranged in the first metal layer.

28. The system of claim 23, wherein another at least two of the number of metal lines are electrically coupled together at the second side in the first metal layer.

29. The system of claim 23, wherein the probe pads comprise first probe pads and each of the number of metal lines is further electrically coupled to a second probe pad at or near the second side.

30. A method of testing memory devices, the method comprising:
electrically coupling a probe to first probe pads and second probe pads of a one-channel memory device, the one-channel memory device comprising:
a first number of memory cells; and
a first number of conductive lines arranged in a first metal layer above the first number of memory cells, the first number of conductive lines extending from substantially a first side of the one-channel memory device to substantially a second side of the one-channel memory device,
at least two of the first number of conductive lines electrically coupled together at or near the second side through a conductive line arranged in a second metal layer below the first metal layer,
each of the first number of conductive lines electrically coupled to:
a respective bond pad positioned at or near the first side, the bond pads configured to receive power;
a respective first probe pad of the first probe pads, the first probe pads arranged at or near the first side; and
a respective second probe pad of the second probe pads, the second probe pads arranged at or near the second side; and
providing power to the one-channel memory device through the first probe pads and the second probe pads.

31. The method of claim 30, further comprising performing first testing operations on the one-channel memory device.

32. The method of claim 30, further comprising:
electrically coupling the probe to third probe pads and fourth probe pads of a two-channel memory device, the two-channel memory device comprising:
a second number of memory cells;
a second number of lines arranged above the second number of memory cells, the second number of lines extending from substantially a third side of the two-channel memory device to a middle portion of the two-channel memory device, each of the second number of lines electrically coupled to a respective third probe pad of the third probe pads, the third probe pads arranged at or near the third side;
a third number of memory cells; and
a third number of lines arranged above the third number of memory cells, the third number of lines extending from substantially a fourth side of the two-channel memory device to the middle portion, each of the third number of lines electrically coupled to a respective fourth probe pad of the fourth probe pads, and the fourth probe pads arranged at or near the fourth side; and
providing power to the two-channel memory device through the third probe pads and the fourth probe pads.

33. The method of claim 32, further comprising:
while the probe is electrically coupled to the first probe pads and the second probe pads, performing first testing operations on the one-channel memory device; and
while the probe is electrically coupled to the third probe pads and the fourth probe pads, performing second testing operations on the two-channel memory device.

* * * * *